(12) United States Patent
Padhi et al.

(10) Patent No.: US 6,899,816 B2
(45) Date of Patent: *May 31, 2005

(54) ELECTROLESS DEPOSITION METHOD

(75) Inventors: Deenesh Padhi, San Jose, CA (US); Joseph Yahalom, Emeryville, CA (US); Sivakami Ramanathan, Fremont, CA (US); Chris R. McGuirk, San Jose, CA (US); Srinivas Gandikota, Santa Clara, CA (US); Girish Dixit, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 254 days.

This patent is subject to a terminal disclaimer.

(21) Appl. No.: 10/117,711

(22) Filed: Apr. 3, 2002

(65) Prior Publication Data

US 2003/0190812 A1 Oct. 9, 2003

(51) Int. Cl.⁷ .............................. B44C 1/22; B05D 3/04; B05D 3/10
(52) U.S. Cl. ........................... 216/52; 216/53; 427/301; 427/304; 427/305
(58) Field of Search .................... 427/301, 304, 427/305, 306; 216/17

(56) References Cited

U.S. PATENT DOCUMENTS

| | | | |
|---|---|---|---|
| 2,369,620 A | 2/1945 | Sullivan et al. | 117/130 |
| 3,937,857 A | 2/1976 | Brummett et al. | 427/98 |
| 4,006,047 A | 2/1977 | Brummett et al. | 156/656 |
| 4,232,060 A | 11/1980 | Mallory et al. | 427/98 |
| 4,234,628 A | 11/1980 | DuRose | 427/305 |
| 4,265,943 A | 5/1981 | Goldstein et al. | 427/305 |

(Continued)

FOREIGN PATENT DOCUMENTS

| | | | |
|---|---|---|---|
| EP | 0 329 406 | 8/1989 | ........... C23C/28/02 |
| EP | 0 475 567 | 3/1992 | ............ H05K/1/09 |
| EP | 0 913 498 | 5/1999 | ........... C23C/18/16 |
| GB | 2285174 | 6/1995 | ........... H01L/23/52 |
| JP | 7-297543 | 11/1995 | ............ H05K/3/38 |
| JP | 11-124682 | 5/1999 | ........... C23C/18/31 |

OTHER PUBLICATIONS

CSBP, Material Safety Data Sheet—Sulfuric Acid (60% Solution).*

Saito, et al., "Electroless deposition of Ni–B, Co–B and Ni–Co–B alloys using dimethylamineborane as a reducing agent," Journal of Applied Electrochemistry 28 (1998), pp. 559–563.

Eze, et al., "Chemical–bath–deposited cobalt sulphide films: preparation effects," Materials Chemistry and Physics, 47 (1997), pp. 31–36.

(Continued)

*Primary Examiner*—Rudy Zervigon
(74) *Attorney, Agent, or Firm*—Moser, Patterson & Sheridan

(57) ABSTRACT

Methods and apparatus are provided for forming a metal or metal silicide layer by an electroless deposition technique. In one aspect, a method is provided for processing a substrate including depositing an initiation layer on a substrate surface, cleaning the substrate surface, and depositing a conductive material on the initiation layer by exposing the initiation layer to an electroless solution. The method may further comprise etching the substrate surface with an acidic solution and cleaning the substrate of the acidic solution prior to depositing the initiation layer. The initiation layer may be formed by exposing the substrate surface to a noble metal electroless solution or a borane-containing solution. The conductive material may be deposited with a borane-containing reducing agent. The conductive material may be used as a passivation layer, a barrier layer, a seed layer, or for use in forming a metal silicide layer.

37 Claims, 4 Drawing Sheets

U.S. PATENT DOCUMENTS

| | | | |
|---|---|---|---|
| 4,364,803 A | 12/1982 | Nidola et al. | 204/30 |
| 4,368,223 A | 1/1983 | Kobayashi et al. | 427/443.1 |
| 4,397,812 A | 8/1983 | Mallory et al. | 420/441 |
| 4,632,857 A | 12/1986 | Mallory, Jr. | 428/209 |
| 4,810,520 A | 3/1989 | Wu | 427/8 |
| 5,147,692 A | 9/1992 | Bengston | 427/438 |
| 5,203,911 A | 4/1993 | Sricharoenchaikit et al. | 106/1.26 |
| 5,235,139 A | 8/1993 | Bengston et al. | 174/257 |
| 5,240,497 A | 8/1993 | Shacham et al. | 106/1.26 |
| 5,248,527 A | 9/1993 | Uchida et al. | 427/437 |
| 5,380,560 A * | 1/1995 | Kaja et al. | 427/306 |
| 5,384,284 A | 1/1995 | Doan et al. | 437/190 |
| 5,415,890 A | 5/1995 | Kloiber et al. | 427/242 |
| 5,478,462 A | 12/1995 | Walsh | 205/169 |
| 5,510,216 A | 4/1996 | Calabrese et al. | 430/16 |
| 5,648,125 A | 7/1997 | Cane | 427/534 |
| 5,674,787 A | 10/1997 | Zhao et al. | 437/203 |
| 5,695,810 A | 12/1997 | Dubin et al. | 427/96 |
| 5,733,816 A | 3/1998 | Iyer et al. | 438/592 |
| 5,755,859 A * | 5/1998 | Brusic et al. | 106/1.22 |
| 5,824,599 A | 10/1998 | Schacham-Diamand et al. | 438/678 |
| 5,830,805 A | 11/1998 | Shacham-Diamand et al. | 438/678 |
| 5,843,538 A | 12/1998 | Ehrsam et al. | 427/601 |
| 5,846,598 A | 12/1998 | Semkow et al. | 427/98 |
| 5,885,749 A | 3/1999 | Huggins et al. | 430/312 |
| 5,891,513 A | 4/1999 | Dubin et al. | 427/98 |
| 5,904,827 A | 5/1999 | Reynolds | 205/68 |
| 5,907,790 A | 5/1999 | Kellam | 438/666 |
| 5,910,340 A | 6/1999 | Uchida et al. | 427/437 |
| 5,913,147 A | 6/1999 | Dubin et al. | 438/687 |
| 5,932,077 A | 8/1999 | Reynolds | 204/224 R |
| 5,933,757 A | 8/1999 | Yoshikawa et al. | 438/682 |
| 5,969,422 A | 10/1999 | Ting et al. | 257/762 |
| 6,010,962 A | 1/2000 | Liu et al. | 438/687 |
| 6,015,724 A | 1/2000 | Yamazaki | 438/151 |
| 6,015,747 A | 1/2000 | Lopatin et al. | 438/586 |
| 6,065,424 A | 5/2000 | Shacham-Diamand et al. | 118/696 |
| 6,077,780 A | 6/2000 | Dubin | 438/687 |
| 6,107,199 A | 8/2000 | Allen et al. | 438/685 |
| 6,110,530 A | 8/2000 | Chen et al. | 427/253 |
| 6,113,771 A | 9/2000 | Landau et al. | 205/123 |
| 6,136,163 A | 10/2000 | Cheung et al. | 204/198 |
| 6,136,693 A | 10/2000 | Chan et al. | 438/633 |
| 6,140,234 A | 10/2000 | Uzoh et al. | 438/678 |
| 6,144,099 A | 11/2000 | Lopatin et al. | 257/758 |
| 6,153,935 A | 11/2000 | Edelstein et al. | 257/773 |
| 6,165,912 A | 12/2000 | McConnell et al. | 438/758 |
| 6,171,661 B1 | 1/2001 | Zheng et al. | 427/535 |
| 6,174,812 B1 | 1/2001 | Hsiung et al. | 438/687 |
| 6,180,523 B1 | 1/2001 | Lee et al. | 438/678 |
| 6,197,181 B1 | 3/2001 | Chen | 205/123 |
| 6,197,364 B1 | 3/2001 | Paunovic et al. | 427/98 |
| 6,197,688 B1 | 3/2001 | Simpson | 438/687 |
| 6,228,233 B1 | 5/2001 | Lakshmikanthan et al. | 204/277 |
| 6,242,349 B1 | 6/2001 | Nogami et al. | 438/687 |
| 6,245,670 B1 | 6/2001 | Cheung et al. | 438/637 |
| 6,251,236 B1 | 6/2001 | Stevens | 204/224 R |
| 6,258,220 B1 | 7/2001 | Dordi et al. | 204/198 |
| 6,258,223 B1 | 7/2001 | Cheung et al. | 204/242 |
| 6,258,270 B1 | 7/2001 | Hilgendorff et al. | 210/321.75 |
| 6,261,637 B1 * | 7/2001 | Oberle | 427/304 |
| 6,291,348 B1 | 9/2001 | Lopatin et al. | 438/687 |
| 6,319,387 B1 | 11/2001 | Krishnamoorthy et al. | 205/240 |
| 6,323,128 B1 | 11/2001 | Sambucetti et al. | 438/678 |
| 6,342,733 B1 | 1/2002 | Hu et al. | 257/750 |
| 6,344,410 B1 | 2/2002 | Lopatin et al. | 438/652 |
| 6,416,647 B1 | 7/2002 | Dordi et al. | 205/137 |
| 6,432,819 B1 | 8/2002 | Pavate et al. | 438/676 |
| 6,436,267 B1 | 8/2002 | Carl et al. | 205/186 |
| 6,436,816 B1 * | 8/2002 | Lee et al. | 438/643 |
| 6,441,492 B1 | 8/2002 | Cunningham | 257/762 |
| 6,516,815 B1 | 2/2003 | Stevens et al. | 134/25.4 |
| 6,528,409 B1 | 3/2003 | Lopatin et al. | 438/618 |
| 6,565,729 B2 | 5/2003 | Chen et al. | 205/82 |
| 6,573,606 B2 | 6/2003 | Sambucetti et al. | 257/762 |
| 6,605,874 B2 | 8/2003 | Leu et al. | 257/758 |
| 6,616,967 B1 | 9/2003 | Test | 427/98 |
| 6,717,189 B2 | 4/2004 | Inoue et al. | 257/200 |
| 6,743,473 B1 | 6/2004 | Parkhe et al. | 427/252 |
| 2001/0030366 A1 | 10/2001 | Nakano et al. | 257/758 |
| 2002/0036143 A1 | 3/2002 | Segawa et al. | 205/187 |
| 2002/0098681 A1 | 7/2002 | Hu et al. | 438/626 |
| 2003/0010645 A1 | 1/2003 | Ting et al. | 205/170 |
| 2003/0075808 A1 | 4/2003 | Inoue et al. | 257/774 |
| 2003/0116439 A1 | 6/2003 | Seo et al. | 205/125 |
| 2003/0181040 A1 | 9/2003 | Ivanov et al. | 438/687 |
| 2003/0189026 A1 | 10/2003 | Padhi et al. | 438/694 |
| 2003/0190426 A1 | 10/2003 | Padhi et al. | 427/307 |

OTHER PUBLICATIONS

Shacham–Diamond, et al., "Electrochemically deposited thin film alloys for ULSI and MEMS applications," Microelectronic Engineering 50 (2000), pp. 525–531.

Lowenheim, Frederick A., *Modern Electroplating*, Chapter 31, pp. 70–79 ($3^{rd}$ ed., Wiley & Sons 1974).

Schacham–Diamond, et al., Material properties of electroless 100–200 nm thick CoWP films, Electrochemical Society Proceedings, vol. 99–34, pp. 102–110.

Eze, F. C., "Electroless deposition of CoO thin films," J. Phys. D: Appl. Phys. 32 (1999), pp. 533–540.

Lin, et al., "Manufacturing of Cu Electroless Nickel/Sn–Pb Flip Chip Solder Bumps", IEEE Transactions on Advanced Packaging, vol. 22, No. 4 (Nov. 1999), pp. 575–579.

The Chinese Journal of Nonferrous Metals, vol. 10, No. 1, Feb. 2, 2000.

Pearlstein, Fred. "Electroless Plating," J. Res. Natl. Bur. Stan., Ch. 31 (1963), pp. 710–747.

U.S. Appl. No. 09/599,125, (Cheung, et al.), filed Jun. 22, 2000.

U.S. Appl. No. 09/245,780, (Dordi, et al.), filed Feb. 5, 1999.

Lopatin, et al., "Thin Electroless barrier for copper films", Part of the SPIE Conference of Multilevel Interconnect technology II, SPIE vol. 3508 (1998), pp. 65–77.

Yosi Shacham–Diamond, et al. "High Aspect Ratio Quarter–Micron Electroless Copper Integrated Technology", Microelectronic Engineering 37/38 (1997) pp. 77–88.

C.K. Hu, et al. "Reduced Electromigration of Cu Wires by Surface Coating" Applied Physics Letters, vol. 81, No. 10, Sep. 2, 2002—pp. 1782–1784.

* cited by examiner

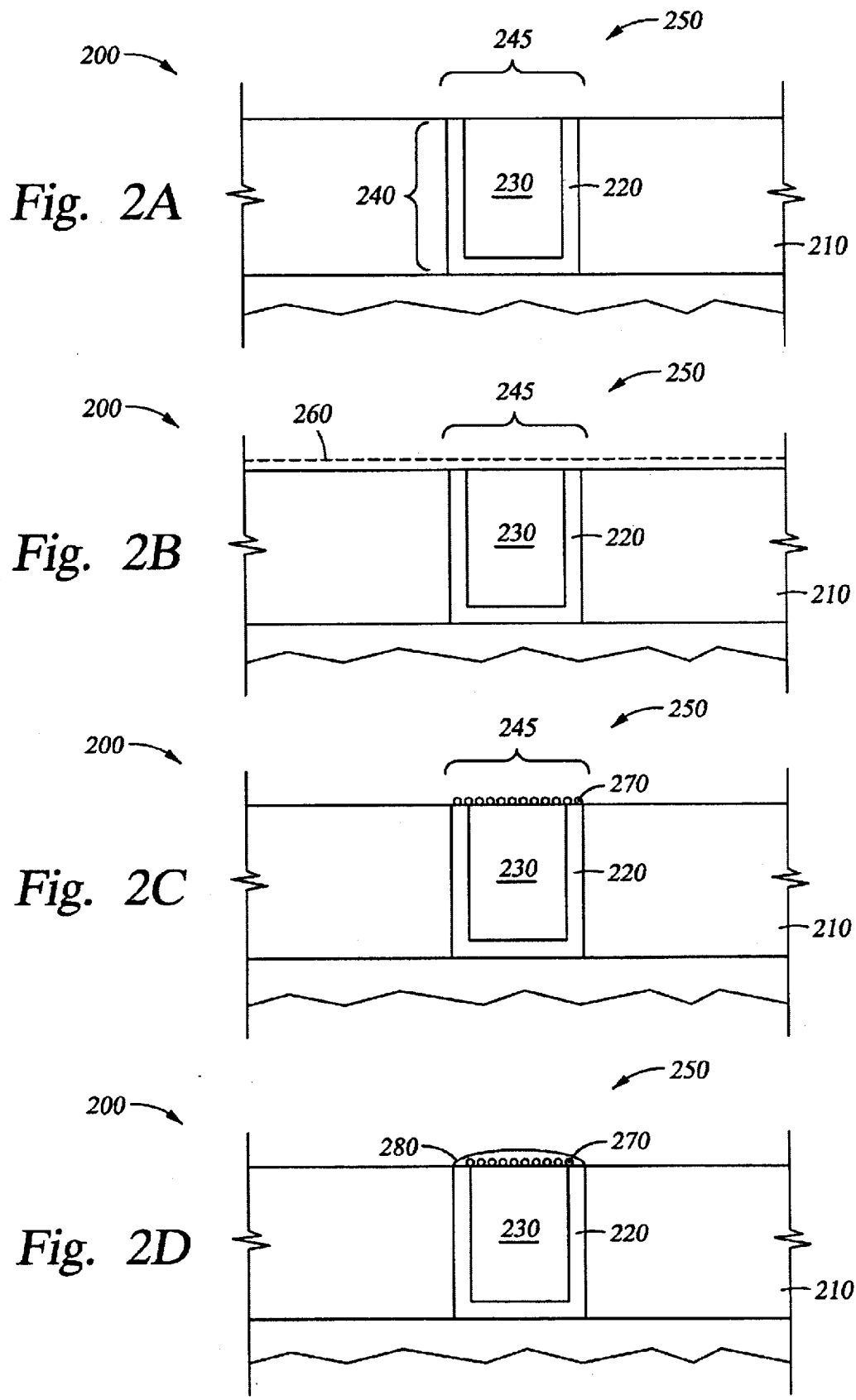

ELECTROLESS DEPOSITION METHOD

BACKGROUND OF THE INVENTION

1. Field of the Invention

The present invention relates to the fabrication of semiconductor devices and to the apparatus and methods for deposition, removal, and modification of materials on a semiconductor substrate.

2. Description of the Related Art

Recent improvements in circuitry of ultra-large scale integration (ULSI) on semiconductor substrates indicate that future generations of semiconductor devices will require sub-quarter micron multi-level metallization. The multilevel interconnects that lie at the heart of this technology require planarization of interconnect features formed in high aspect ratio apertures, including contacts, vias, lines and other features. Reliable formation of these interconnect features is very important to the success of ULSI and to the continued effort to increase circuit density and quality on individual substrates and die as features decrease below 0.13 µm in size.

Currently, copper and its alloys have become the metals of choice for sub-micron interconnect technology because copper has a lower resistivity than aluminum, (1.7 µΩ-cm compared to 3.1 µΩ-cm for aluminum), a higher current carrying capacity, and significantly higher electromigration resistance. These characteristics are important for supporting the higher current densities experienced at high levels of integration and increased device speed. Further, copper has a good thermal conductivity and is available in a highly pure state.

Electroplating is one process being used to fill high aspect ratio features on substrates. Electroplating processes typically require a thin, electrically conductive seed layer to be deposited on the substrate. Electroplating is accomplished by applying an electrical current to the seed layer and exposing the substrate to an electrolytic solution containing metal ions that plate over the seed layer.

Electroless deposition is another process used to deposit conductive materials. Although electroless deposition techniques have been widely used to deposit conductive metals over non-conductive printed circuit boards, electroless deposition techniques have not been extensively used for forming interconnects in VLSI and ULSI semiconductors. Electroless deposition involves an auto catalyzed chemical deposition process that does not require an applied current for a plating reaction to occur. Electroless deposition typically involves exposing a substrate to a solution by immersing the substrate in a bath or by spraying the solution over the substrate.

However, copper readily forms copper oxide when exposed to atmospheric conditions or environments outside of processing equipment and requires a passivation layer to prevent metal oxide formation. Metal oxides can result in an increase the resistance of metal layers, become a source of particle problems, and reduce the reliability of the overall circuit.

Additionally, metal oxides may also detrimentally affect subsequent processing. In one example, oxides may interfere with electroless deposition techniques. Electroless deposition techniques require a surface capable of electron transfer for nucleation, i.e., catalyzing, of a conductive material over that surface, and oxidized surfaces, for example on copper seed layers and metal barrier layers, cannot sufficiently participate in electron transfer for effective electroless deposition.

One solution is to deposit a passivation layer or encapsulation layer on the metal layer to prevent metal oxide formation. Cobalt and cobalt alloys have been observed as suitable materials for passivating copper. Cobalt may also be deposited by electroless deposition techniques on copper. However, copper does not satisfactorily catalyze or initiate deposition of materials from electroless solutions. One solution is to initiate deposition from an electroless solution by contacting the copper substrate with a ferrous material that initiates deposition though a galvanic reaction. However, the process requires a continuous conductive surface over the substrate surface that may not be possible with some passivation applications. Another solution is to activate the copper surface by depositing a catalytic material on the copper surface. However, deposition of the catalytic material may require multiple steps or use catalytic colloid compounds. Catalytic colloid compounds may adhere to dielectric materials and result in undesired, excessive, and non-selective deposition of the passivation material on the substrate surface. Non-selective deposition of passivation material may lead to surface contamination, unwanted diffusion of conductive materials into dielectric materials, and even device failure from short circuits and other device irregularities.

Therefore, there is a need for a method and composition for electroless deposition of conductive materials in sub-micron features in a substrate surface.

SUMMARY OF THE INVENTION

Embodiments of the invention described herein generally provide methods and compositions for forming a metal or a metal silicide layer using an electroless deposition process. In one aspect, a method is provided for processing a substrate including polishing a substrate surface to expose a first conductive material disposed in a dielectric material, depositing an initiation layer on the first conductive material, cleaning the substrate surface of the first electroless solution, and depositing a second conductive material on the initiation layer by exposing the initiation layer to an electroless solution. The initiation layer may be formed by exposing the substrate surface to a noble metal electroless solution. The second conductive material may be deposited as a passivation layer, a barrier layer, a seed layer, or for use in forming a metal silicide layer.

In another aspect, a method is provided for processing a substrate including polishing a substrate surface to expose a first conductive material disposed in a dielectric material, etching the substrate surface with an acidic solution, cleaning the substrate of the acidic solution, depositing an initiation layer selectively on the first conductive material by exposing the substrate surface to a first electroless solution, cleaning the substrate surface of the first electroless solution, and depositing a second conductive material on the initiation layer by exposing the initiation layer to a second electroless solution. The initiation layer may be formed by exposing the substrate surface to a noble metal electroless solution. The second conductive material may be deposited as a passivation layer, a barrier layer, a seed layer, or for use in forming a metal silicide layer.

In another aspect, a method is provided for processing a substrate including polishing a substrate surface to expose a first conductive material disposed in a dielectric material, exposing the substrate surface to a solution comprising a boron-containing reducing agent, forming initiation sites on the exposed first conductive material, and depositing a second conductive material on the initiation sites by exposing the substrate surface to an electroless solution containing a reducing agent. The second conductive material may be deposited as a passivation layer, a barrier layer, a seed layer, or for use in forming a metal silicide layer.

In another aspect, a method is provided for processing a substrate including polishing a substrate surface to expose a first conductive material disposed in a dielectric material and depositing a second conductive material on the first conductive metal by exposing the substrate surface to an electroless solution containing a boron-containing reducing agent. The second conductive material may be deposited as a passivation layer, a barrier layer, a seed layer, or for use in forming a metal silicide layer.

BRIEF DESCRIPTION OF THE DRAWINGS

So that the manner in which the above recited aspects of the invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

FIGS. 2A–2D are schematic sectional views of one deposition process described herein;

DETAILED DESCRIPTION OF THE PREFERRED EMBODIMENTS

Figure 1:
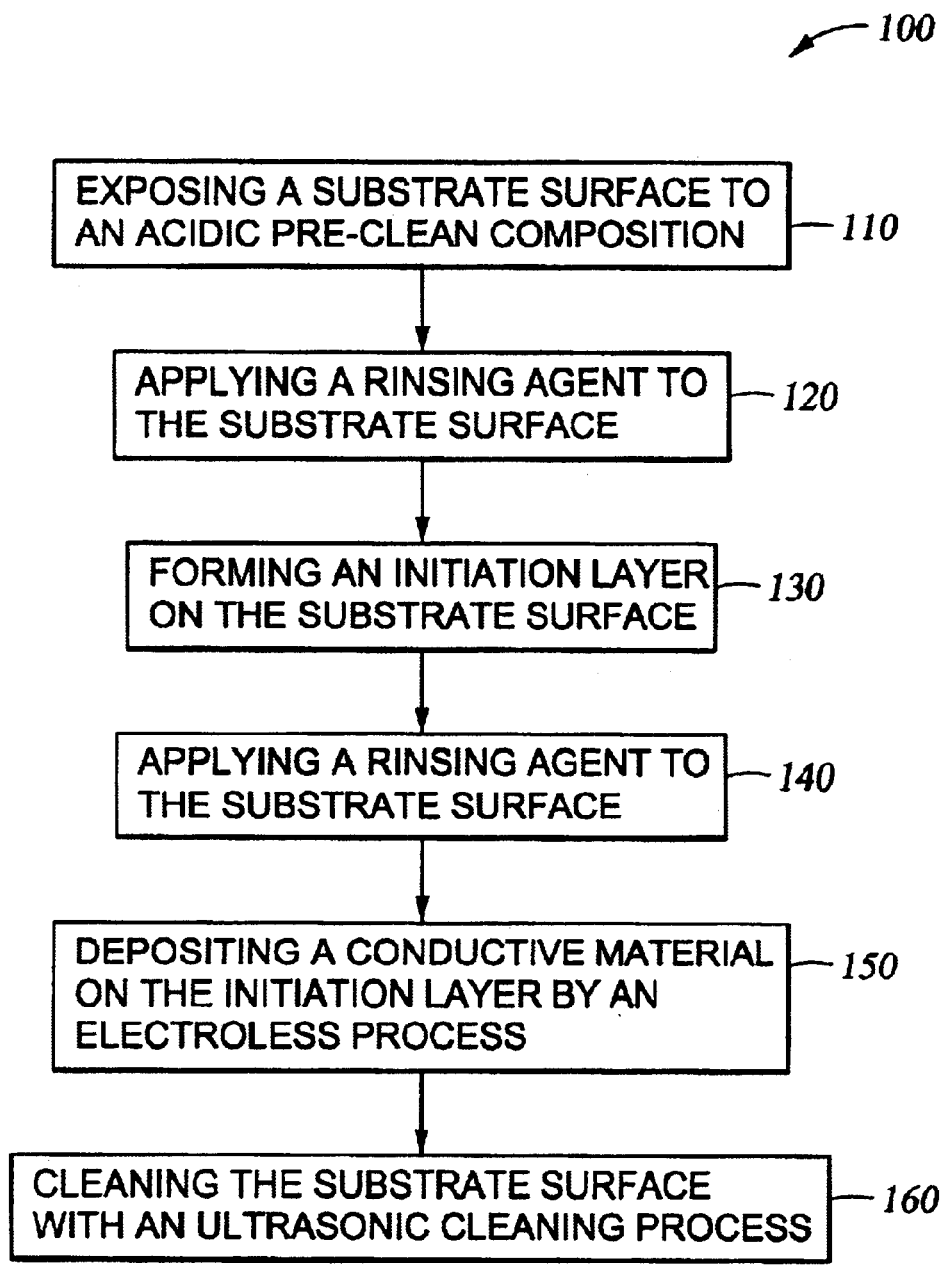
FIG. 1 is a flow chart illustrating steps undertaken in depositing conductive layers according to one embodiment of the invention.

Embodiments of the invention described herein provide methods and apparatus for depositing a conductive material by an electroless process. One material that may be deposited is cobalt or cobalt alloys, which may be deposited as a passivation layer, a barrier layer, a seed layer, or used in the formation of a metal silicide layer.

The words and phrases used herein should be given their ordinary and customary meaning in the art by one skilled in the art unless otherwise further defined. Electroless deposition is broadly defined herein as deposition of a conductive material generally provided as charged ions in a bath over a catalytically active surface to deposit the conductive material by chemical reduction in the absence of an external electric current.

The processes described herein are performed in apparatus suitable for performing electroless deposition processes. Suitable apparatus include an Electra™ ECP processing platform or Link™ processing platform that are commercially available from Applied Materials, Inc., located in Santa Clara, Calif. The Electra Cu™ ECP platform, for example, includes an integrated processing chamber capable of depositing a conductive material by an electroless process, such as an electroless deposition processing (EDP) cell, which are commercially available from Applied Materials, Inc., located in Santa Clara, Calif. The Electra Cu™ ECP platform generally includes one or more electroless deposition processing (EDP) cells as well as one or more pre-deposition or post-deposition cell, such as spin-rinse-dry (SRD) cells, etch chambers, or annealing chambers. The Electra™ ECP processing platform is more fully described in U.S. Pat. No. 6,258,223, issued on Jul. 10, which is incorporated by reference herein the extent not inconsistent with the claimed aspects and description herein. Embodiment of the Link™ processing platform are described in U.S. patent application Ser. No. 09/603,792, filed on Jun. 26, 2000, and in U.S. patent application Ser. No. 09/891,849, filed on Jun. 25, 2001, which are incorporated by reference herein the extent not inconsistent with the claimed aspects and description herein.

The Electroless Deposition Process

In one aspect, a conductive material may be deposited as a passivation layer on exposed conductive materials after a planarization or material removal process. In one embodiment, the passivation layer is deposited by the use of an initiation layer formed by the electroless deposition of a noble metal. In another embodiment, an initiation layer is formed using a borane-containing solution to form a metal boride layer. Optionally, an acidic pre-treatment can be used prior to depositing or forming the initiation layer. The electroless conductive layer can be deposited as a barrier layer or a seed layer in a metallization process. In another aspect, an electroless conductive layer is deposited on a silicon-containing material and annealed to form a metal silicide layer. Cobalt and cobalt alloys are examples of compounds that are deposited by the conductive material electroless deposition process.

FIG. 1 is a flow chart illustrating steps undertaken in depositing conductive layers according to one embodiment of the invention. A substrate is introduced into the process 100 and exposed to an acidic pre-clean or etching process to remove at least a portion of a substrate surface at Step 110. The substrate surface generally comprises both dielectric materials and conductive materials. The etched substrate is then rinsed with a rinsing agent, such as deionized water, at Step 120.

An initiation layer is then deposited on the substrate surface at Step 130. The initiation layer may be electroless deposition of a noble metal on the exposed conductive material of the substrate surface or may be a metal boride formed from the exposure of the exposed conductive metal to a borane-containing solution. The initiation layer generally forms selectively on the exposed conductive materials.

The substrate surface is then rinsed with a rinsing agent to remove the electroless solution or borane-containing solution at Step 140. A second conductive material is then electroless deposited on the initiation layer at Step 150. The second conductive material is generally cobalt or a cobalt alloy. The second conductive material is selectively deposited on the exposed initiation layer. The substrate surface is then cleaned using an ultrasonic or megasonic cleaning process at Step 160.

The pre-cleaning composition is an acidic solution, such as an inorganic acid solution. In one aspect, the acidic solution may comprise between about 0.2 weight percent (wt. %) and about 5 wt. % of hydrofluoric acid (HF), for example, about 0.5 wt. % of HF acid. The acid solution may also comprise nitric acid at a concentration of between about 1 M and about 5 M, for example about 1 M. Alternatively, the nitric acid solution may comprise a ratio of nitric acid to water, such as deionized water, at a ratio of about 5:1 and about 1:5.

The acidic solution may also comprises a composition of sulfuric acid at a concentration of between about 0.5 vol % and about 10 vol % of the composition, for example between about 1 vol % and about 5 vol %, and hydrogen peroxide at a concentration between about 5 vol % and about 40 vol % of 35% hydrogen peroxide, for example about 20 vol % concentration of 35% hydrogen peroxide.

The pre-cleaning composition is generally applied to the substrate surface for between about 5 seconds and about 300 seconds, for example, between about 30 seconds and about 60 seconds, at a flow rate between about 50 ml/min and about 2000 ml/min, for example, between about 700 ml/min and about 900 ml/min including about 750 ml/min, and at a composition temperature between about 15° C. and about 60° C., such as between about 20° C. and about 25° C. Alternatively, a total application of between about 120 ml and about 200 ml of the pre-cleaning solution may be used to treat the substrate surface. The pre-cleaning solution may be applied in the same processing chamber or processing cell as subsequent deposition processes. An example of the pre-cleaning composition is about 0.5 wt. % of hydrofluoric acid, which may be applied at a flow rate of about 750 ml for about 60 seconds at a composition temperature between about 20° C. and about 25° C.

The pre-cleaning solution of Step 110 is applied to remove or etch a top portion of the exposed dielectric layer, such as between about 10 Å and about 50 Å, which may contain contaminant conductive materials from a prior processing step. For example, stray copper ions may contaminant the top portion of a dielectric material following a chemical mechanical polishing or planarizing process.

A rinsing agent, typically deionized water, is then applied to the substrate surface to remove any remaining pre-cleaning composition, any etched materials and particles, and any by-products that may have formed during the pre-cleaning process at Step 120. The rinsing agent is generally applied to the substrate surface for between about 5 seconds and about 300 seconds, for example, between about 30 seconds and about 60 seconds, at a flow rate between about 50 ml/min and about 2000 ml/min, for example, between about 700 ml/min and about 900 ml/min including about 750 ml/min, and at a temperature between about 15° C. and about 80° C., such as between about 20° C. and about 25° C. Alternatively, a total application of between about 120 ml and about 200 ml of the rinsing agent may be used to treat the substrate surface. The rinsing agent may be applied by spraying method as well as by any other method for cleaning a substrate, such as by rinsing in an enclosure containing a cleaning solution or bath. An example of the rinsing agent is deionized water, which may be applied at a flow rate of about 750 ml for about 60 seconds at a temperature between about 20° C. and about 25° C.

In one embodiment, an initiation layer is formed on the exposed conductive materials by the electroless deposition of a noble metal in Step 130. The noble metal is selected from the group of palladium, platinum, or combinations thereof. The invention contemplates the use of other noble metals, such as gold, silver, iridium, rhenium, rhodium, rhenium, ruthenium, osmium, and combinations thereof. The noble metal is deposited from an electroless solution containing at least a noble metal salt, and an inorganic acid. Examples of noble metal salts include palladium chloride ($PdCl_2$), palladium sulfate ($PdSO_4$), palladium ammonium chloride, and combinations thereof. Examples of inorganic acids include hydrochloric acid (HCl), sulfuric acid ($H_2SO_4$), hydrofluoric acid (HF) and combinations thereof. Alternatively, inorganic acids, such as carboxylic acids including acetic acid ($CH_3COOH$), may be used in the electroless solution for the initiation layer.

The noble metal salt may be in the electroless solution at a concentration between about 20 parts per million (ppm) and about 20 g/liter, such as between about 80 ppm and about 300 ppm, and, for example, about 120 ppm. The concentration of the metal salt may also be described as a volume percent with 1 vol % corresponding to about 40 ppm. For example, 120 ppm of the noble metal salt correspond to about 3 vol %. The inorganic acid is used to provide an acidic electroless composition, for example, a pH of about 7 or less. A pH level between about 1 and about 3 has been observed to be effective in electroless deposition of the noble metals from the electroless solution. An acidic solution has also been observed to be effective in removing or reducing oxides, such as metal oxides including copper oxides, from the metal or dielectric surface of the substrate during the electroless deposition process.

The electroless solution for the initiation layer is generally applied to the substrate surface for between about 1 second and about 300 seconds, for example, between about 5 seconds and about 60 seconds, at a composition temperature between about 15° C. and about 80° C., such as between about 20° C. and about 25° C. The electroless solution is generally provided at a flow rate between about 50 ml/min and about 2000 ml/min, for example, between about 700 ml/min and about 900 ml/min including about 750 ml/min. In one aspect a total application of about 120 ml and about 200 ml of electroless solution was provided to deposit the electroless layer. The electroless solution generally provides for the deposition of a noble metal to a thickness of about 50 Å or less, such as about 10 Å or less. The initiation layer may be continuous or discontinuous.

An example of an electroless composition for depositing the initiation material includes about 3 vol % (120 ppm) of palladium chloride and sufficient hydrochloric acid to provide a pH of about 1.5 for the composition, which is applied to the substrate surface for about 30 seconds at a flow rate of about 750 ml/min at a composition temperature of about 25° C.

In another embodiment, the initiation layer is formed by rinsing or exposing the exposed conductive materials to a borane-containing composition in Step 130. The borane-containing composition forms a metal boride layer selectively on the exposed conductive metals, which are catalytic sites for subsequent electroless deposition processes.

The borane-containing composition includes a borane reducing agent. Suitable borane-containing reducing agents include alkali metal borohydrides, alkyl amine boranes, and combinations thereof. Examples of suitable borane-containing reducing agents include sodium borohydride, dimethylamine borane (DMAB), trimethylamine borane, and combinations thereof. The borane-containing reducing agent comprises between about 0.25 grams per liter (g/L) and about 6 g/L, for example, between about 2 g/L and about 4 g/L, of the boron-containing composition. The borane-containing composition may additionally include pH adjusting agents to provide a pH of between about 8 and about 13. Suitable pH adjusting agents include potassium hydroxide (KOH), sodium hydroxide (NaOH), ammonium hydroxide, ammonium hydroxide derivatives, such as tetramethyl ammonium hydroxide, and combinations thereof.

The conductive material is exposed to the borane-containing composition between about 30 seconds and about 180 seconds, for example, between about 60 seconds and about 120 seconds, at a composition temperature between about 15° C. and about 80° C., such as between about 20° C. and about 25° C. The borane-containing composition may be delivered to the substrate at a flow rate between about 50 ml/min and about 2000 ml/min, for example, between about 700 ml/min and about 900 ml/min including about 750 ml/min. In one aspect a total application of about 120 ml and about 200 ml of the borane-containing composition was provided to form the initiation layer of a metal boride compound.

An example of a borane-containing composition for forming the layer includes about 4 g/L of dimethylamine borane (DMAB) and sufficient sodium hydroxide to provide a pH of about 9 for the composition, which is applied to the substrate surface for about 30 seconds at a flow rate of about 750 ml/min at a composition temperature of about 25° C.

A rinsing agent, typically deionized water, is then applied to the substrate surface to remove any solution used in forming the initiation layer at Step 140. The rinsing agent is generally applied to the substrate surface for between about 5 seconds and about 300 seconds, for example, between about 30 seconds and about 60 seconds, at a flow rate between about 50 ml/min and about 2000 ml/min, for example, between about 700 ml/min and about 900 ml/min including about 750 ml/min, and at a temperature between about 15° C. and about 80° C., such as between about 20° C. and about 25° C. Alternatively, a total application of between about 120 ml and about 200 ml of the rinsing agent may be used to treat the substrate surface. The rinsing agent may be applied by spraying method as well as by any other method for cleaning a substrate, such as by rinsing in an enclosure containing a cleaning solution or bath. An example of the rinsing agent is deionized water, which may be applied at a flow rate of about 750 ml for about 60 seconds at a temperature between about 20° C. and about 25° C.

A metal layer is deposited by an electroless process on the initiation layer at Step 150. In one aspect, the metal layer comprises cobalt or a cobalt alloy. Cobalt alloys include cobalt-tungsten alloy, cobalt-phosphorus alloy, cobalt-tin alloys, cobalt-boron alloys, including ternary alloys, such as cobalt-tungsten-phosphorus and cobalt-tungsten-boron. However, the invention contemplates the use of other materials, including nickel, tin, titanium, tantalum, tungsten, molybdenum, platinum, iron, niobium, palladium, platinum, and combinations thereof, and other alloys including nickel cobalt alloys, doped cobalt and doped nickel alloys, or nickel iron alloys, to form the metal layer as described herein.

In one embodiment, the metal material is deposited from an electroless solution containing at least a metal salt and a reducing agent. The electroless solution may further include additives to improve deposition of the metal. Additives may include surfactants, complexing agents, pH adjusting agents, or combinations thereof.

Suitable metal salts include chlorides, sulfates, sulfamates, or combinations thereof. An example of a metal salt is cobalt chloride. The metal salt may be in the electroless solution at a concentration between about 0.5 g/L and about 30 g/L, such as between about 2.5 g/L and about 25 g/L.

Cobalt alloys, such as cobalt-tungsten may be deposited by adding tungstic acid or tungstate salts including sodium tungstate, and ammonium tungstate, and combinations thereof for tungsten deposition. Phosphorus for the cobalt-tungsten-phosphorus deposition may be form by phosphorus-containing reducing agents, such as hypophosphite. Cobalt alloys, such as cobalt-tin may be deposited by adding stannate salts including stannic sulfate, stannic chloride, and combinations thereof. The additional metals salts, for example, for tungsten and tin, may be in the electroless solution at a concentration between about 0.5 g/L and about 30 g/L, such as between about 2.5 g/L and about 25 g/L.

Suitable reducing agents include sodium hypophosphite, hydrazine, formaldehyde, and combinations thereof. The reducing agents may also include borane-containing reducing agents, such as dimethylamine borane and sodium borohydride. The reducing agents have a concentration between about 1 g/L and about 30 g/L of the electroless solution. For example, hypophosphite may be added to the electroless between about 15 g/L and about 30 g/L of the electroless composition.

Additives include surfactants, such as RE 610, complexing agents including salts of carboxylic acids, for example, sodium citrate and sodium succinate, pH adjusting agents including sodium hydroxide and potassium hydroxide, and combinations thereof. The additives can be used to control deposition properties of the electroless solution. For example, stabilizers prevent unwanted side reactions while complexing agents may limit available ions in the electroless solution for deposition of the substrate surface. Additives have a concentration between about 0.01 g/L and about 50 g/L of the electroless solution, such as between about 0.05 g/L and about 4 g/L, of the electroless solution. An example of an additive is the surfactant RE 610, which may be added to the electroless composition at a concentration between about 0.01 g/L and about 5 g/L. Stabilizers, for example, thiourea and glycolic acid, may also be in the composition at a concentration of about 1 wt. % or less, such as about 0.01 wt. %.

Forming the metal layer includes applying the metal electroless solutions described herein to the substrate surface for between about 30 seconds and about 180 seconds, for example, between about 60 seconds and about 120 seconds, at a composition temperature between about 60° C. and about 90° C., such as between about 70° C. and about 80° C. The electroless solution is generally provided at a flow rate between about 50 ml/min and about 2000 ml/min, for example, between about 700 ml/min and about 900 ml/min including about 750 ml/min. In one aspect a total application of between about 120 ml and about 200 ml of electroless solution was provided to deposit the electroless layer. The electroless solution generally provides for the deposition of a metal layer to a thickness of about 500 Å or less, such as between about 300 Å and about 400 Å.

An example of a cobalt electroless composition for forming the metal layer includes about 20 g/L of cobalt sulfate, about 50 g/L of sodium citrate, about 20 g/L of sodium hypophosphite, with sufficient potassium hydroxide to provide a pH of between about 9 and about 11 for the composition, which is applied to the substrate surface for about 120 seconds at a flow rate of about 750 ml/min at a composition temperature of about 80° C. A cobalt-tungsten layer is deposited by the addition of about 10 g/L of sodium tungstate.

In an alternative embodiment of the metal deposition process, the metal material is deposited from an electroless solution containing at least a metal salt and a borane-containing reducing agent. Suitable metal salts include chlorides, sulfates, include chlorides, sulfates, sulfamates, or combinations thereof. An example of a metal salt is cobalt chloride. The metal salt may be in the electroless solution at a concentration between about 0.5 g/L and about 30 g/L, such as between about 2.5 g/L and about 25 g/L.

Cobalt alloys, such as cobalt-tungsten may be deposited by adding tungstic acid or tungstate salts including sodium tungstate, and ammonium tungstate, and combinations thereof for tungsten deposition. Phosphorus for the cobalt-tungsten-phosphorus deposition may be form by phosphorus-containing reducing agents, such as hypophosphite. Cobalt alloys, such as cobalt-tin may be deposited by adding stannate salts including stannic sulfate, stannic chloride, and combinations thereof. The additional metals salts, for example, for tungsten and tin, may be in the electroless solution at a concentration between about 0.5 g/L and about 30 g/L, such as between about 2.5 g/L and about 25 g/L.

Suitable borane-containing reducing agents include alkali metal borohydrides, alkyl amine boranes, and combinations thereof. Examples of suitable borane-containing reducing agents include sodium borohydride, dimethylamine borane (DMAB), trimethylamine borane, and combinations thereof. The borane-containing reducing agent comprises between about 0.25 grams per liter (g/L) and about 6 g/L, for example, between about 2 g/L and about 4 g/L, of the boron-containing composition. The presence of borane-containing reducing agents allow for the formation of cobalt-boron alloys such as cobalt-tungsten-boron and cobalt-tin-boron among others.

Additives include surfactants, such as RE 610, complexing agents including salts of carboxylic acids, for example, sodium citrate and sodium succinate, and combinations thereof. The additives can be used to control deposition properties of the electroless solution. For example, stabilizers prevent unwanted side reactions while complexing agents may limit available ions in the electroless solution for deposition of the substrate surface.

Additives have a concentration between about 0.01 g/L and about 50 g/L of the electroless solution, such as between about 0.05 g/L and about 4 g/L, of the electroless solution. An example of an additive is the surfactant RE 610, which may be added to the electroless composition at a concentration between about 0.01 g/L and about 5 g/L. Stabilizers, for example, thiourea and glycolic acid, may also be in the composition at a concentration of about 1 wt. % or less, such as about 0.01 wt. %.

The borane-containing composition may additionally include pH adjusting agents to provide a pH of between about 8 and about 13. Suitable pH adjusting agents include potassium hydroxide (KOH), sodium hydroxide (NaOH), ammonium hydroxide, ammonium hydroxide derivatives, such as tetramethyl ammonium hydroxide, and combinations thereof.

Forming the metal layer includes applying the metal electroless solutions described herein to the substrate surface for between about 30 seconds and about 180 seconds, for example, between about 60 seconds and about 120 seconds, at a composition temperature between about 60° C. and about 90° C., such as between about 70° C. and about 80° C. The electroless solution is generally provided at a flow rate between about 50 ml/min and about 2000 ml/min, for example, between about 700 ml/min and about 900 ml/min including about 750 ml/min. In one aspect a total application of between about 120 ml and about 200 ml of electroless solution was provided to deposit the electroless layer. The electroless solution generally provides for the deposition of a metal layer to a thickness of about 500 Å or less, such as between about 300 Å and about 400 Å.

An example of a cobalt electroless composition for forming the metal layer with a borane-containing reducing agent includes about 20 g/L of cobalt sulfate, about 50 g/L of sodium citrate, about 4 g/L of dimethylamineborane, with sufficient potassium hydroxide to provide a pH of between about 10 and about 12 for the composition, which is applied to the substrate surface for about 120 seconds at a flow rate of about 750 ml/min at a composition temperature of about 80° C. A cobalt-tungsten-boron layer is deposited by the addition of about 10 g/L of sodium tungstate.

Borane-containing reducing agents in the metal electroless deposition process are believed to allow electroless deposition on exposed conductive material without the need for an initiation layer. When an initiation layer is first deposited on the substrate surface prior to the metal electroless deposition, the process is typically performed in two processing chambers. When the metal electroless deposition process occurs without the initiation layer, such as with the use of borane-containing reducing agents in the metal electroless deposition, the electroless process can be performed in one chamber.

The substrate surface is then exposed to an ultrasonic or megasonic cleaning process at Step 160. The cleaning process uses a cleaning composition includes a dilute hydrochloric acid to provide a pH between about 1 and about 3 and de-ionized water. The cleaning composition is generally applied to the substrate surface for between about 5 seconds and about 300 seconds at a temperature between about 15° C. and about 80° C.

Agitation may be provided by ultrasonic or megasonic energy applied to the substrate support pedestal or substrate surface. For example, the ultrasonic energy is applied between about 10 and about 250 Watts, but such as between about 10 and about 100 Watts. The ultrasonic energy may have a frequency of about 25 kHz to about 200 kHz, for example, greater than about 40 kHz since this is out of the audible range and contains fewer disruptive harmonics. If one or more sources of ultrasonic energy are used, then simultaneous multiple frequencies may be used. The ultrasonic energy may be applied between about 3 and about 600 seconds, but longer time periods may be used depending upon the application.

The acidic cleaning composition and application of ultrasonic or mega-sonic energy is believed clean any free cobalt particles, remove any cobalt oxide or reaction by-products, such as $Co(OH)_2$ formed during deposition. The cleaning solution is also believed to remove a thin layer of cobalt material, such as about 20 Å or less, to remove any random growth or lateral growth of cobalt materials on the substrate surface and over the exposed conductive materials. The substrate may then be transferred for additional processing, such as annealing or subsequent deposition processes.

Additionally, the method of depositing the material from an electroless solution, whether the initiation layer or metal layer, may include applying a bias to a conductive portion of the substrate structure if available (i.e. a seed layer), such as a DC bias, during the electroless deposition process. It is believed that the bias helps to remove trapped hydrogen gas formed in the catalytic layer during the deposition process.

The initiation layer and/or metal layer may be annealed (i.e., heating) at a temperature between about 100° C. to about 400° C., for example, between about 100° C. to about 300° C. The anneal may be performed in a vacuum, for example, at a pressure lower than 1 mTorr. Alternatively, the anneal may be performed in a gas atmosphere, such as a gas atmosphere of one or more noble gases (such as Argon, Helium), nitrogen, hydrogen, and mixtures thereof. In one embodiment, the anneal is performed for a time period of at least about 1 minute. In another embodiment, the anneal is performed for a time period of about 1 to about 10 minutes. The anneal may be conducted by a rapid thermal anneal process. It is believed that annealing the substrate promotes adhesion of the electroless deposited material to the substrate surface and exposed conductive materials, including barrier layers and seed layers. It is also believe that the anneal helps remove hydrogen formed in the electroless deposited materials during the deposition.

Metallization Deposition Processes

Embodiments of the processes described herein relate to depositing metal and metal silicide layers for passivation layers, barrier layers, seed layers, and metal silicide layers in feature formation. The following embodiments are provided for illustrative purposes and should not be construed or interpreted as limiting the invention described herein.

Passivation Layer Deposition

In one aspect, a metal layer is deposited as a passivation layer on exposed features as shown in FIGS. 2A–2D. In FIG. 2A, a substrate 200 is provided having a feature 250 formed therein. The feature 250 is formed by depositing and patterning a photoresist material by conventional photolithographic and etching techniques to define a feature opening 240 in one or more dielectric materials 210 and etching the dielectric materials 210 to define the aperture 240. The one or more dielectric materials 210 include, for example, silicon dioxide, phosphorus-doped silicon glass (PSG), boron-phosphorus-doped silicon glass (BPSG), silicon carbide, carbon-doped silicon dioxide, as well as low dielectric constant materials, including fluoro-silicon glass (FSG), polymers, such as polymides, and carbon-containing silicon oxides, such as Black Diamond™, available from Applied Materials, Inc. of Santa Clara, Calif. The invention also contemplates that one or more dielectric materials 210 may include semiconductive silicon-containing materials including polysilicon, doped polysilicon, or combinations thereof, deposited by methods known or unknown in the art.

A barrier layer 220 is deposited over the dielectric material. The barrier layer 220 may be deposited to prevent or inhibit diffusion of subsequently deposited materials into the underlying substrate or dielectric layers. Suitable barrier layer materials include refractory metals and refractory metal nitrides such as tantalum (Ta), tantalum nitride ($TaN_x$), titanium (Ti), titanium nitride ($TiN_x$), tungsten (W), tungsten nitride ($WN_x$), cobalt, cobalt alloys such as cobalt-tungsten alloy, cobalt-phosphorus alloy, cobalt-tin alloys, cobalt-tungsten-phosphorus, cobalt-tungsten-boron, and combinations thereof. The barrier layer may be deposited by chemical vapor deposition (CVD), physical vapor deposition (PVD), electroless deposition techniques, or molecular beam epitaxy among others. The barrier layer may also be a multi-layered film deposited individually or sequentially by the same or by a combination of techniques, such as a tantalum nitride layer deposited on a tantalum layer, both layers deposited by a physical vapor deposition technique.

The aperture 240 is then filled by the deposition of a conductive material 230 into the feature. Conductive materials 230 may include, for example, copper or tungsten. The conductive material 230, may be deposited by chemical vapor deposition (CVD), physical vapor deposition (PVD), electrochemical deposition techniques, such as electroplating, or combinations thereof, with copper, for example, deposited by an electroplating technique. Optionally, a seed layer (not shown) of a conductive material may be deposited before the conductive material 230 to nucleate and enhance the subsequent deposition of the conductive material 230.

Following deposition of the material in the aperture 240, the filled aperture may be further processed by planarizing the substrate surface and a top portion of the aperture to form feature 250, such as by chemical mechanical polishing (CMP). During the planarization process, portions of the one or more dielectric materials 210, the barrier layer 220, and the conductive material 230 are removed from the top of the structure leaving a planar surface having exposed conductive material 245 of the feature 250 in the dielectric materials 210 as shown in FIG. 2A.

The substrate is then rinsed or cleaned. One rinsing or cleaning process may include exposing to an acidic pre-clean or etching composition to remove at least a portion of a substrate surface as indicated by the dashed line 260 in FIG. 2B prior to a rinsing step. The pre-cleaning composition may, for example, include an acidic solution of about 0.5 wt. % of HF acid, which is applied to the substrate surface for between about 30 seconds and about 60 seconds at a composition temperature between about 20° C. and about 25° C. The etched substrate is then rinsed with deionized water to remove any pre-cleaning solution from the substrate surface.

An initiation layer 270 is then deposited on the substrate surface at Step 130. In FIG. 2C, the initiation layer 270 is deposited by the electroless deposition of a noble metal on the exposed conductive material of the substrate surface. The initiation layer 270 is selectively formed on the exposed conductive materials 245. The initiation layer may be deposited, for example, by an initiation electroless solution comprising between about 80 ppm and about 300 ppm palladium chloride ($PdCl_2$) and sufficient hydrochloric acid (HCl) to produce a pH of between about 1 and about 3. The acidity of the initiation electroless solution is generally provided in sufficient amounts to be effective in removing or reducing oxides, such as metal oxides including copper oxides, from the metal or dielectric surface of the substrate during the electroless deposition process. The initiation electroless solution is generally applied to the substrate surface for between about 5 seconds and about 60 seconds at a solution temperature between about 20° C. and about 25° C., or at conditions sufficient to deposit the initiation layer to a thickness of about 10 Å or less.

Alternatively, a boride layer may be formed by exposing the barrier layer to a composition including a borane-containing reducing agent, for example, about 4 g/L of dimethylamine borane (DMAB) and sufficient sodium hydroxide to provide a pH of about 9 for the composition, which is applied to the substrate surface for about 30 seconds at a composition temperature of about 25° C. The substrate surface is then rinsed with deionized water to remove any remaining electroless solution or borane-containing composition.

A passivation layer 280 of a metal, such as cobalt or cobalt alloy, is then deposited on the initiation layer 270 as shown in FIG. 2D. The passivation layer is deposited from an electroless technique using an electroless solution containing a metal salt and a reducing agent. For example, a passivation electroless solution of between about 2.5 g/L and about 20 g/L, of cobalt chloride and cobalt sulfate, and between about 15 g/L and about 30 g/L, of sodium hypophosphite, and sufficient base to provide a pH level of between about 9 and about 11, may be used to form the passivation layer. Dimethylamine borane may be used as the reducing agent at a concentration between about 0.25 g/L and about 6 g/L. The passivation electroless solution is generally applied to the substrate surface for between about 5 seconds and about 120 seconds at a solution temperature between about 20° C. and about 25° C.

The substrate surface is then cleaned using a cleaning composition comprising HCl at a pH between about 1 and about 3 for between about 5 seconds and about 300 seconds at a solution temperature between about 15° C. and about 80° C. Ultrasonic energy is applied to the cleaning composition and/or substrate to improve the cleaning process. The cleaning composition is generally applied under conditions sufficient to remove about 20 Å or less of the passivation layer.

Barrier/Seed Layer Deposition

In one aspect, a seed layer or barrier layer by an electroless deposition processes described herein in a metallization process.

While the following description is for the deposition of a seed layer by the processes described herein, the invention contemplates depositing a barrier layer by the electroless process described herein by exposing a dielectric surface of the substrate directly to a composition for forming an initiation layer. The initiation layer will form on the dielectric surface and allow for the deposition of the metal layer, such as cobalt, thereon. The initiation layer may form continuously or non-continuously over the exposed dielectric surface. For example, palladium can be deposited on the dielectric material for a cobalt barrier deposition. If cobalt is used a barrier layer material, the seed layer may be a copper material.

Figures 3A, 3B, 3C, 3D:
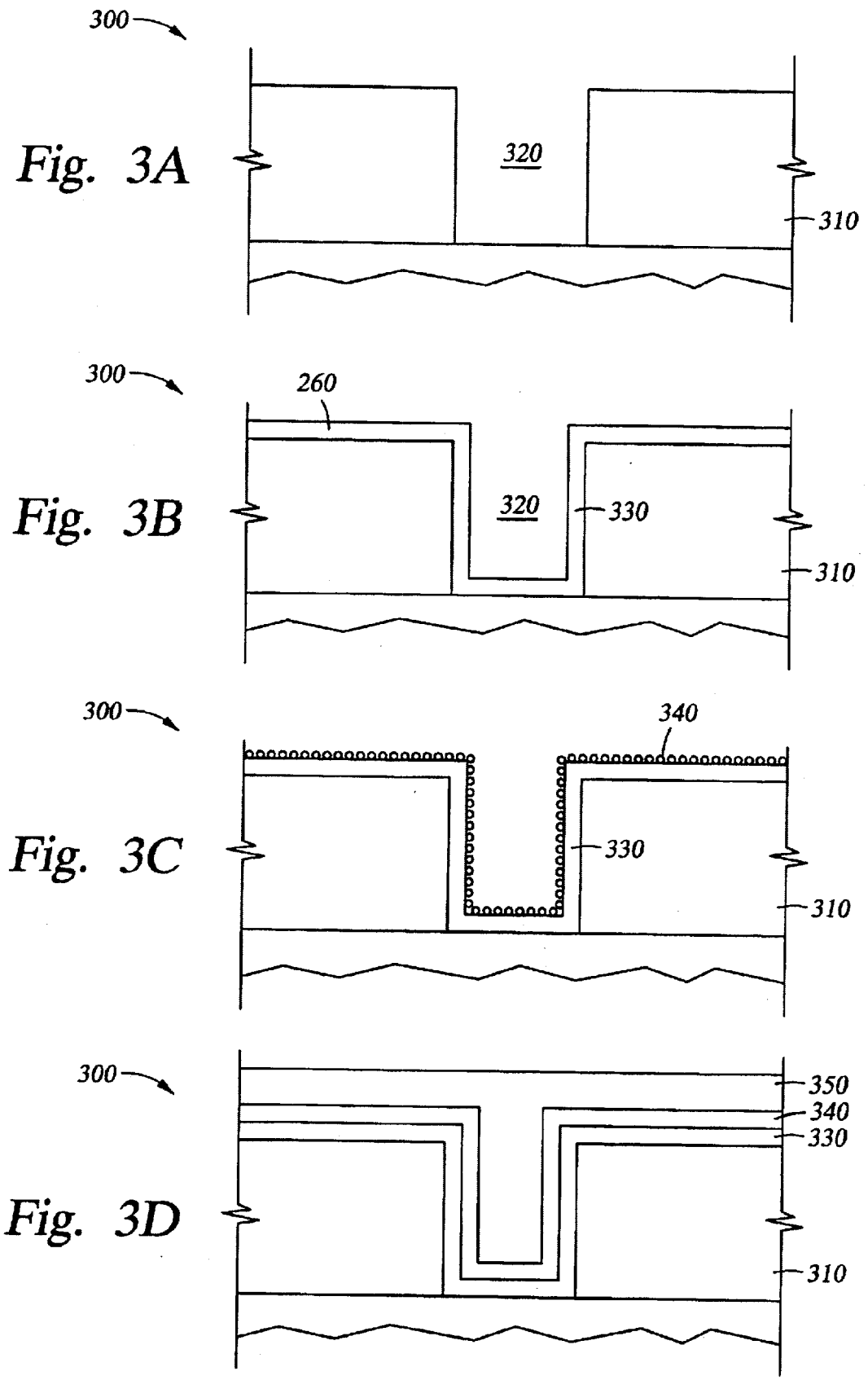
FIGS. 3A–3D are schematic sectional views of one deposition process described herein.

In one aspect, a seed layer is deposited by the electroless process described herein in a metallization scheme as shown in FIGS. 3A–3D. In FIG. 3A, a substrate 300 is provided having an aperture 320 formed in one or more dielectric materials 310. The aperture 320 is formed by depositing and patterning a photoresist material by conventional photolithographic and etching techniques to define a feature opening in one or more dielectric materials 310 and then etching the dielectric materials 310 to define the aperture 320.

The one or more dielectric materials 310 include, for example, silicon dioxide, phosphorus-doped silicon glass (PSG), boron-phosphorus-doped silicon glass (BPSG), silicon carbide, carbon-doped silicon dioxide, as well as low dielectric constant materials, including fluoro-silicon glass (FSG), polymers, such as polymides, and carbon-containing silicon oxides, such as Black Diamond™, available from Applied Materials, Inc. of Santa Clara, Calif. The invention also contemplates that layer 310 may include semi-conductive silicon-containing materials including polysilicon, doped polysilicon, or combinations thereof, deposited by methods known or unknown in the art.

A barrier layer 330 is deposited in the aperture 320 and over the dielectric material forming the substrate surface as shown in FIG. 3B. The barrier layer 330 may be deposited to prevent or inhibit diffusion of subsequently deposited materials over the barrier layer 330 into the underlying substrate or dielectric layers. Suitable barrier layer materials include refractory metals and refractory metal nitrides such as tantalum (Ta), tantalum nitride ($TaN_x$), titanium (Ti), titanium nitride ($TiN_x$), tungsten (W), tungsten nitride ($WN_x$), cobalt, cobalt alloys such as cobalt-tungsten alloy, cobalt-phosphorus alloy, cobalt-tin alloys, cobalt-tungsten-phosphorus, cobalt-tungsten-boron, and combinations thereof. The barrier layer 330 may be deposited by chemical vapor deposition (CVD), physical vapor deposition (PVD), electroless deposition techniques, or molecular beam epitaxy among others. The barrier layer 330 may also be a multi-layered film deposited individually or sequentially by the same or by a combination of techniques, such as a tantalum nitride layer deposited on a tantalum layer, both layers deposited by a physical vapor deposition technique.

A seed layer 340 of a metal layer is deposited over the barrier layer 330 by an electroless deposition process as shown in FIG. 3C. Suitable seed layer materials include cobalt, cobalt alloys such as cobalt-tungsten alloy, cobalt-phosphorus alloy, cobalt-tin alloys, cobalt-tungsten-phosphorus, cobalt-tungsten-boron, and combinations thereof. The seed layer may be deposited by first forming or depositing an initiation layer and then the bulk of the seed layer material.

For example, the initiation layer may be a noble metal deposited by an initiation electroless solution comprising between about 80 ppm and about 300 ppm palladium chloride ($PdCl_2$) and sufficient hydrochloric acid (HCl) to produce a pH of between about 1 and about 3. The initiation electroless solution is generally applied to the substrate surface for between about 5 seconds and about 60 seconds at a solution temperature between about 20° C. and about 25° C., or at conditions sufficient to deposit the initiation layer to a thickness of about 10 Å or less.

Alternatively, a boride layer may be formed by exposing the barrier layer to a composition including a borane-containing reducing agent, for example, about 4 g/L of dimethylamine borane (DMAB) and sufficient sodium hydroxide to provide a pH of about 9 for the composition, which is applied to the substrate surface for about 30 seconds at a composition temperature of about 25° C. The substrate surface is then rinsed with deionized water to remove any remaining electroless solution or borane-containing composition.

Then the bulk of the seed layer material, such as cobalt or cobalt alloy, is deposited on the initiation layer. The bulk of the seed layer material is deposited from an electroless technique using an electroless solution containing a metal salt and a reducing agent. For example, an electroless solution of between about 2.5 g/L and about 20 g/L, of cobalt chloride and/or cobalt sulfate, and between about 15 g/L and about 30 g/L, of sodium hypophosphite, and sufficient base to provide a pH level of between about 9 and about 11, may be used. Dimethylamine borane may be used as the reducing agent at a concentration between about 0.25 g/L and about 6 g/L. The electroless solution is generally applied to the substrate surface for between about 5 seconds and about 120 seconds at a solution temperature between about 20° C. and about 25° C.

The substrate surface is then cleaned using a cleaning composition comprising HCl at a pH between about 1 and about 3 for between about 5 seconds and about 300 seconds at a solution temperature between about 15° C. and about 80° C. Ultrasonic energy is applied to the cleaning composition and/or substrate to improve the cleaning process. The cleaning composition is generally applied under conditions sufficient to remove about 20 Å or less of the seed layer 340.

The aperture is then filled by the deposition of a conductive material 350 into the feature. Conductive materials 350 may include, for example, copper or tungsten. The conductive material 350, may be deposited by chemical vapor deposition (CVD), physical vapor deposition (PVD), electrochemical deposition techniques, such as electroplating, or combinations thereof, with copper, for example, deposited by an electroplating technique. An example of a conductive fill of tungsten on a cobalt barrier or seed layer is more fully described in U.S. patent application Ser. No. 10/044,412, filed on Jan. 9, 2002, entitled, "Barrier Formation Using A Novel Sputter Deposition Method", which is incorporated by reference herein to the extent not inconsistent with the disclosure or claims herein.

Following deposition of the material in the aperture, the filled aperture may be further processed by annealing or planarizing the top portion of the aperture to form a feature, such as by chemical mechanical polishing (CMP). During the planarization process, portions of the one or more dielectric materials 310, the barrier layer 330, the seed layer 340, and the conductive material 350 are removed from the top of the structure leaving a fully planar surface leaving exposed conductive material 350 in the dielectric materials 310.

Silicide Layer Formation

A metal silicide layer may be formed by depositing a metal on a silicon-containing material and annealing the metal and silicon-containing material to form a metal silicide layer. Metal silicide is broadly defined herein as an alloy of metal and silicon, which may exist in multiple valence phases. For example cobalt and silicon can exist in the CoSi and $CoSi_2$ phases. The annealing process to form the metal silicide layer may be performed in one or more annealing steps and may be performed concurrently with further deposition processes.

While the following material describes the formation of a metal silicide layer from a cobalt or cobalt alloy layer, the invention contemplates the use of other materials, including nickel, tin, titanium, tantalum, tungsten, molybdenum, platinum, iron, niobium, palladium, platinum, and combinations thereof, and other alloys including nickel cobalt alloys, cobalt tungsten alloys, cobalt nickel tungsten alloys, doped cobalt and nickel alloys, or nickel iron alloys, to form the metal silicide material as described herein.

Figure 4:
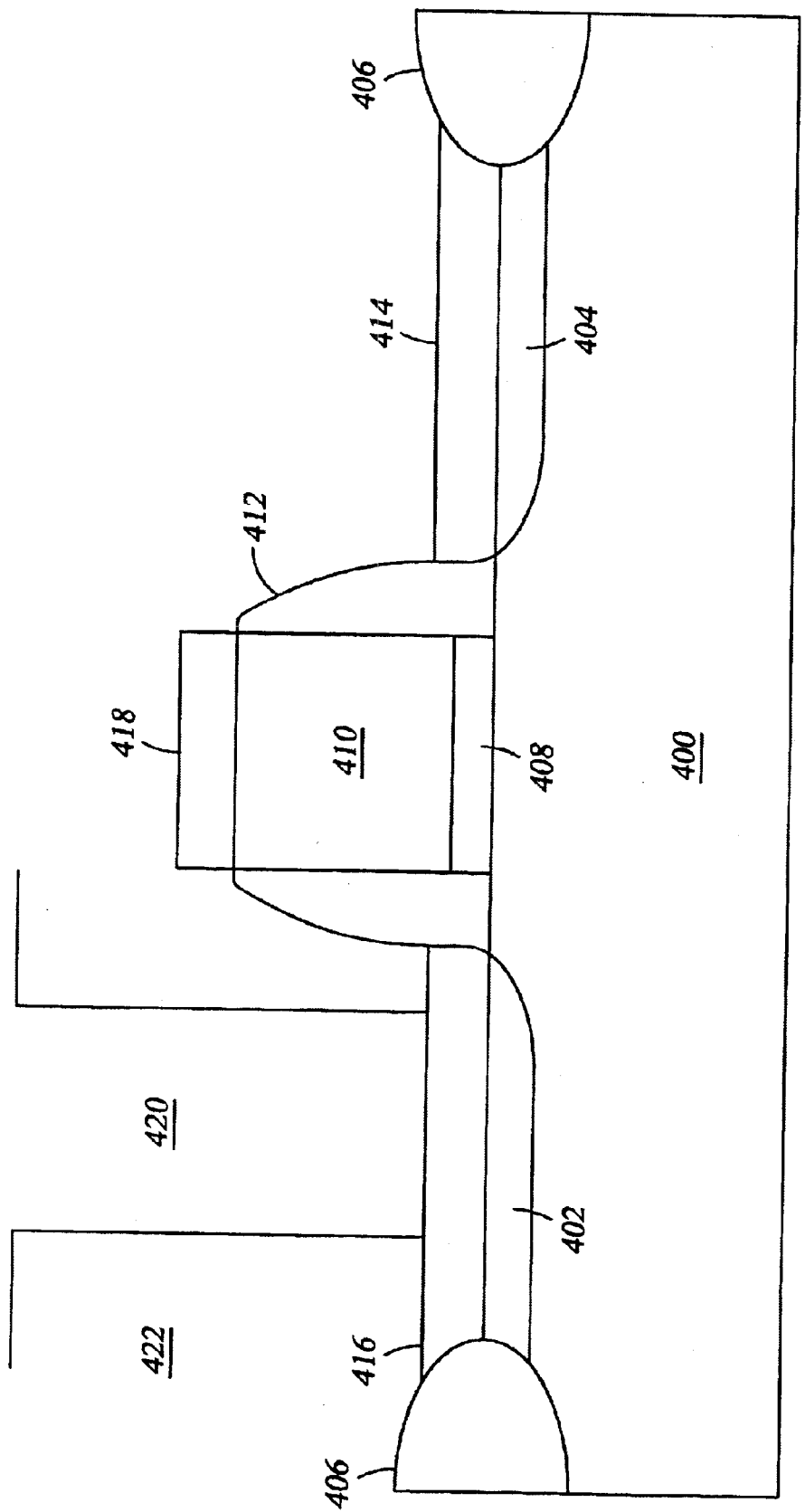
FIG. 4 is a simplified sectional view of a silicide material used as a contact with a transistor.

One example of a metal silicide application includes the formation of a MOS device shown in FIG. 4. In the illustrated MOS structure, conductive N+ source and drain regions 402 and 404 are formed in a P type silicon substrate 400 adjacent field oxide portions 406. A gate oxide layer 408 and a polysilicon gate electrode 410 are formed over silicon substrate 400 in between source and drain regions 402 and 404 with oxide spacers 412 formed on the sidewalls of polysilicon gate electrode 410.

A cobalt layer is deposited over the MOS structure, and in particular over the exposed silicon surfaces of the conductive source and drain regions 402 and 404, and the exposed top surface of polysilicon gate electrode 410 by the process described herein.

In one aspect, the cobalt layer may be deposited by the processes described herein. For example, an initiation layer is first deposited over the substrate surface and in particular over the exposed silicon surfaces of the conductive source and drain regions 402 and 404. The initiation layer (not shown) may include a noble metal, of which noble metals that form silicides are typically used. The initiation layer is deposited by an initiation electroless solution comprising between about 80 ppm and about 300 ppm palladium chloride ($PdCl_2$) and sufficient hydrochloric acid (HCl) to produce a pH of between about 1 and about 3. The initiation electroless solution is generally applied to the substrate surface for between about 5 seconds and about 60 seconds at a solution temperature between about 20° C. and about 25° C., or at conditions sufficient to deposit the initiation layer to a thickness of about 10 Å or less.

Alternatively, a boride layer may be formed by exposing the silicon-based materials to a composition including a borane-containing reducing agent, for example, about 4 g/L of dimethylamine borane (DMAB) and sufficient sodium hydroxide to provide a pH of about 9 for the composition, which is applied to the substrate surface for about 30 seconds at a composition temperature of about 25° C. The substrate surface is then rinsed with deionized water to remove any remaining electroless solution or borane-containing composition.

A metal layer of cobalt or cobalt alloy is then deposited on the initiation layer. The cobalt layer is deposited from an electroless technique using an electroless solution containing a cobalt salt and a reducing agent. For example, an electroless solution of between about 2.5 g/L and about 20 g/L, of cobalt chloride and/or cobalt sulfate, and between about 15 g/L and about 30 g/L, of sodium hypophosphite, and sufficient base to provide a pH level of between about 9 and about 11, may be used. Dimethylamine borane may be used as the reducing agent at a concentration between about 0.25 g/L and about 6 g/L. The electroless solution is generally applied to the substrate surface for between about 5 seconds and about 120 seconds at a solution temperature between about 20° C. and about 25° C. The substrate surface may then be cleaned prior to subsequent processing The cobalt material is deposited to a thickness of about 1000 Å or less for the subsequent reaction with the underlying silicon at 402 and 404. For example, cobalt may be deposited to a thickness between about 50 Å and about 500 Å on the silicon material.

In one aspect, the cobalt layer is then annealed by a two-step annealing process to form cobalt silicide. For example, a two step annealing process is used to convert the metal layer to a first phase of metal silicide, such as partially or completely converting cobalt and silicon to a first cobalt silicide (CoSi) phase, in a first annealing process; and substantially converted the metal layer to the desired silicide phase, such as such as converting the first cobalt silicide (CoSi) phase to a cobalt silicide ($CoSi_2$) product, in a second annealing step.

The one or more annealing steps are generally performed at an annealing temperature between about 300° C. and about 900° C. and may be for a time between about 10 seconds and about 600 seconds each. For example, the substrate may be heated to a temperature between about 400° C. and about 600° C. for between about 5 seconds and about 300 seconds, such as about 500° C. for between about 60 seconds and about 120 seconds, and then heated to a temperature between about 600° C. and about 900° C. for a period of time between about 5 seconds and about 300 seconds to form the metal silicide layer, such as at 800° C. for between about 60 seconds and 120 seconds.

The first annealing step may be performed immediately after deposition of the cobalt layer. The second annealing step may be performed before, after, or during deposition of subsequent materials, such as during a chemical vapor deposition of a tungsten fill layer. The second annealing process generally has a higher annealing temperature than the first annealing process.

Two step annealing process for forming metal suicides are more fully described in U.S. patent application Ser. No. 09/916,234, filed on Jul. 25, 2001, entitled, "In-Situ Annealing Process In Physical Vapor Deposition System", and U.S. patent application Ser. No. 10/044,412, filed on Jan. 9, 2002, entitled, "Barrier Formation Using A Novel Sputter Deposition Method", which are incorporated by reference herein to the extent not inconsistent with the disclosure or claims herein.

Dielectric materials 422 may be deposited over the formed structure and etched to provide contact definitions 420 in the device. The contact definitions may then be filled with a contact material, such as tungsten, aluminum, or copper, from chemical vapor deposition techniques, such as described herein.

In one aspect, any unreacted cobalt from the annealing processes may be removed from the substrate surface, typically by a wet etch process or plasma etch process, and the cobalt silicide remains as cobalt silicide ($CoSi_2$) portions 414, 416, and 418 of uniform thickness respectively formed over polysilicon gate electrode 410 and over source and drain regions 402 and 404 in silicon substrate 400. Unreacted cobalt may be removed by a plasma process in a DPS™ chamber located on the same vacuum processing system, or may be transferred to another processing system for processing. Wet etch process are typically performed in a second processing system.

A selective etch of the unreacted metal layer from the metal silicide layer may be performed concurrently or after annealing. Additional deposition of materials, such as a layer of barrier material or the second metal layer, may be performed concurrently or after annealing.

While not shown, a barrier or liner layer of a material, such as titanium nitride, may be deposited on the cobalt material to further enhance the barrier properties of the cobalt layer. The deposition of the titanium nitride layer may replace the step of removing unreacted cobalt as described above. However, the unreacted cobalt and titanium may be removed by the etch process after annealing of the substrate surface according to the anneal processes described herein.

While the foregoing is directed to embodiments of the present invention, other and further embodiments of the invention may be devised without departing from the basic scope thereof, and the scope thereof is determined by the claims that follow.

What is claimed is:

1. A method of processing a substrate, comprising:
   polishing a substrate surface to expose a first conductive material disposed in a dielectric material;
   depositing an initiation layer on the first conductive material by exposing the substrate surface to a first electroless solution having a pH between about 1 and about 3;
   removing oxides from the substrate surface;
   cleaning the substrate surface of the first electroless solution; and
   depositing a second conductive material on the initiation layer by exposing the initiation layer to a second electroless solution.

2. The method of claim 1, wherein the initiation layer is continuous or non-continuous.

3. The method of claim 1, wherein the initiation layer is deposition to a thickness of about 10 Å or less.

4. The method of claim 1, wherein the first electroless solution comprises a noble metal salt and an inorganic acid.

5. The method of claim 4, wherein the noble metal salt comprises a salt of palladium, platinum, or combinations thereof.

6. The method of claim 4, wherein the noble metal salt is selected from the group of a chloride salt, a sulfate salt, sulfamate salt, or combinations thereof, and the inorganic acid is selected from the group of hydrochloric acid, sulfuric acid, hydrofluoric acid, or combinations thereof.

7. The method of claim 4, wherein the noble metal salt has a concentration of between about 20 parts per million and about 20 grams per liter of the first electroless solution.

8. The method of claim 1, wherein the first conductive material is exposed to the first electroless solution for about 300 seconds or less.

9. The method of claim 1, wherein the first conductive material is copper, the initiation layer comprises a noble metal selected from the group of palladium, platinum, and combinations thereof, and the second conductive material comprises cobalt or a cobalt alloy.

10. A method of processing a substrate, comprising:
    polishing a substrate surface to expose copper features formed in a dielectric material;
    depositing a noble metal selected from the group of palladium, platinum, and combinations thereof, selectively on the exposed copper features by exposing the substrate surface to an acidic electroless solution containing a noble metal salt, an inorganic acid, and having a pH between about 1 and about 3;
    removing copper oxides from the exposed copper features;
    cleaning the substrate surface of the acidic electroless solution; and
    depositing cobalt or cobalt alloy on the noble metal with a cobalt electroless composition.

11. The method of claim 10, wherein the noble metal salt is selected from the group of a chloride salt, a sulfate salt, sulfamate salt, or combinations thereof, and the inorganic acid is selected from the group of hydrochloric acid, sulfuric acid, hydrofluoric acid, or combinations thereof.

12. The method of claim 10, wherein the noble metal salt has a concentration of between about 20 parts per million and about 20 grams per liter of the acidic electroless solution.

13. The method of claim 10, wherein the first conductive material is exposed to the acidic electroless solution for about 300 seconds or less.

14. The method of claim 10, wherein the acidic electroless solution has a temperature of between about 15° C. and about 80° C.

15. The method of claim 10, wherein the noble metal salt comprises palladium chloride or palladium sulfate at a concentration of between about 20 parts per million and about 20 grams per liter, and the inorganic acid comprises hydrochloric acid or sulfuric acid aqueous solution, and the acidic electroless solution is applied to the substrate surface for about 300 seconds or less at a temperature between about between about 15° C. and about 80° C.

16. The method of claim 10, wherein the initiation layer is deposited continuous or non-continuous to a thickness of about 10Å or less.

17. A method of processing a substrate comprising a dielectric material and apertures formed therein, the method comprising:
    depositing an initiation layer of a conductive material on the dielectric material and apertures formed therein by a first electroless solution comprising a noble metal salt, an inorganic acid, and a pH of about 7 or less;
    cleaning the substrate surface of the first electroless solution; and
    depositing a cobalt-containing layer on the initiation layer by a second electroless solution.

18. The method of claim 17, further comprising:
    depositing a seed layer on the cobalt-containing layer; and
    depositing a conductive material layer on the seed layer.

19. The method of claim 17, further comprising depositing a conductive material layer on the cobalt-containing layer.

20. The method of claim 17, wherein the noble metal salt comprises a salt of palladium, platinum, or combinations thereof.

21. The method of claim 17, wherein the noble metal salt is selected from the group of a chloride salt, a sulfate salt, sulfamate salt, or combinations thereof, and the inorganic acid is selected from the group of hydrochloric acid, sulfuric acid, hydrofluoric acid, or combinations thereof.

22. The method of claim 17, wherein the noble metal salt has a concentration of between about 20 parts per million and about 20 grams per liter of the first electroless solution.

23. The method of claim 17, wherein the dielectric material is exposed to the electroless solution for about 300 seconds or less.

24. The method of claim 17, wherein the first electroless solution has a pH between about 1 and about 3.

25. The method of claim 17, wherein the noble metal salt comprises palladium chloride or palladium sulfate at a concentration of between about 20 parts per million and about 20 grams per liter, and the inorganic acid comprises hydrochloric acid or sulfuric acid aqueous solution, and the acidic electroless solution is applied to the substrate surface for about 300 seconds or less at a temperature between about between about 15° C. and about 80° C.

26. A method of processing a substrate having a conductive silicon-based material disposed thereon with patterned apertures formed therein, the method comprising:
- depositing an initiation layer on the substrate surface by a first electroless solution comprising a noble metal salt, an inorganic acid, and a pH of about 7 or less;
- cleaning the substrate surface of the first electroless solution;
- depositing a first metal material on the initiation layer by exposing the initiation layer to a second electroless solution; and
- forming a metal silicide layer by reacting the conductive silicon-based material and the first metal layer using one or more annealing processes.

27. The method of claim 26, further comprising depositing a second metal layer on the metal silicide layer.

28. The method of claim 26, wherein the noble metal salt comprises a salt of palladium, platinum, or combinations thereof.

29. The method of claim 26, wherein the noble metal salt is selected from the group of a chloride salt, a sulfate salt, sulfamate salt, or combinations thereof, and the inorganic acid is selected from the group of hydrochloric acid, sulfuric acid, hydrofluoric acid, or combinations thereof.

30. The method of claim 26, wherein the noble metal salt has a concentration of between about 20 parts per million and about 20 grams per liter of the first electroless solution.

31. The method of claim 26, wherein the substrate surface is exposed to the electroless solution for about 300 seconds or less.

32. The method of claim 26, wherein the first electroless solution has a pH between about 1 and about 3.

33. The method of claim 26, wherein the initiation layer comprises a noble metal selected from the group of palladium, platinum, and combinations thereof, and the first metal material comprises cobalt or a cobalt alloy.

34. The method of claim 26, wherein the one or more annealing processes comprise annealing the substrate at a temperature between about 300° C. and about 900° C. to form the metal silicide layer.

35. The method of claim 26, further comprising etching unreacted first metal after the one or more annealing steps.

36. The method of claim 26, wherein a layer of barrier material is deposited on the initiation layer prior to depositing the first metal material.

37. The method of claim 26, further comprising treating the substrate surface to remove oxide formation by a hydrofluoric dipping technique or a plasma etch technique.

* * * * *